United States Patent [19]

Brunsvold et al.

[11] Patent Number: 4,931,379
[45] Date of Patent: Jun. 5, 1990

[54] HIGH SENSITIVITY RESISTS HAVING AUTODECOMPOSITION TEMPERATURES GREATER THAN ABOUT 160° C.

[75] Inventors: William R. Brunsvold, Poughkeepsie; Willard E. Conley, Cornwall; Dale M. Crockatt, Somers, all of N.Y.; Nancy E. Iwamoto, Portland, Oreg.

[73] Assignee: International Business Machines Corporation, Armonk, N.Y.

[21] Appl. No.: 267,738

[22] Filed: Nov. 3, 1988

Related U.S. Application Data

[63] Continuation of Ser. No. 922,657, Oct. 24, 1986, abandoned.

[51] Int. Cl.$^5$ .................. G03C 1/495; G03C 1/71
[52] U.S. Cl. .................................. 430/270; 430/156; 430/176; 430/192; 430/271; 430/312; 430/325; 430/326
[58] Field of Search ................ 430/270, 192, 176

[56] References Cited

U.S. PATENT DOCUMENTS

| | | | |
|---|---|---|---|
| 3,779,778 | 12/1973 | Smith et al. | 430/270 |
| 4,286,049 | 8/1981 | Imamura et al. | 430/270 |
| 4,491,628 | 1/1985 | Ito et al. | 430/270 |
| 4,603,101 | 7/1986 | Crivello | 430/270 |
| 4,663,268 | 5/1987 | Turner et al. | 430/326 |
| 4,678,737 | 7/1987 | Schneller et al. | 430/270 |
| 4,689,289 | 8/1987 | Crivello | 430/270 |
| 4,845,009 | 7/1989 | Kita et al. | 430/270 |

*Primary Examiner*—Charles L. Bowers, Jr.
*Attorney, Agent, or Firm*—John A. Stemwedel

[57] ABSTRACT

The present invention relates to increasing the autodecomposition temperature of particular resists. The resists are comprised of structures having recurrent acid labile groups which are typically pendant to the polymeric backbone. The autodecomposition temperature of a resist is increased by selecting substituent sidechains on the acid labile group which exhibit increased stability. Sidechain structures which provide increased autodecomposition stability include secondary structures capable of forming secondary carbonium ion intermediates and having an available proton adjacent to the carbonium ion formed during cleavage. Moieties which can be used as the secondary sidechain structures include secondary alkyl, including both cyclic and alicyclic alkyl, substituted deactivated secondary benzyl, and 1-(deactivated heterocyclic) secondary alkyl.

11 Claims, 6 Drawing Sheets

FIG. 5A  WHEREIN R = CH3 AND H

FIG. 5B  WHEREIN R = CH3 AND H

HIGH SENSITIVITY RESISTS HAVING AUTODECOMPOSITION TEMPERATURES GREATER THAN ABOUT 160° C.

This application is a continuation of application Ser. No. 922,657, filed Oct. 24, 1986, abandoned.

BACKGROUND OF THE INVENTION

1. FIELD OF THE INVENTION

The present invention relates to increasing the autodecomposition temperature of particular resists. The resists are comprised of structures having recurrent acid labile groups which are typically pendant to the polymeric backbone.

2. BACKGROUND ART

Processing of semiconductor devices frequently requires the use of temperatures as high as 200° C.; as a result, it is important to have resist structures which can withstand such temperatures without experiencing autodecomposition.

In U.S. Pat. No. 3,779,778, Smith et al. disclosed novel photosolubilizable compositions comprising (1) a water-insoluble compound containing one or more acid-degradable groups, and (2) a photoinitiator comprising a photolyzable acid progenitor.

In U.S. Pat. No. 4,491,628, resists sensitive to UV, electron beam and X-ray radiation capable of forming positive or negative tone patterns upon proper choice of a developer are formulated from a polymer having recurrent pendant groups such as tert-butyl ester or tert-butyl carbonates that undergo efficient acidolysis with concomitant changes in polarity (solubility) together with a photoinitiator which generates acid upon radiolysis. A sensitizer component that alters wavelength sensitivity may also be added. The preferred acid labile pendant groups are tert-butyl esters of carboxylic acids and tert-butyl carbonates of phenols but, it is understood that a wide range of acid labile groups are operative in the invention. These include trityl, benzyl, benzhydryl modifications as well as others well known in the art.

Resists formulated using the preferred tert-butyl esters of carboxylic acids and tert-butyl carbonates of phenols include, for example, poly (tert-butyl vinylbenzoate) (PTBVB) and poly(4-t-butyloxycarbonyloxystyrene) (PTBCS). The autodecomposition temperature (temperature at which the acid labile or photo labile functional group undergoes change or breakdown in the absence of acidolysis or irradiation, respectively) of the PTBVB is about 160° C. as measured by TGA at a heating rate of about 10° C./minute, and the autodecomposition of the PTBCS is about 150° C. at the same heating rate. Thus, there is a need to increase the autodecomposition temperatures if resists formulated from these types of resist materials with acid labile or photo labile pendant groups are to be useful in electronic device processing which may reach temperatures as high as 200° C.

SUMMARY OF THE INVENTION

In accordance with the present invention, there are particular polymeric materials having acid labile groups pendant to the polymer backbone which can be used to produce resist structures having autodecomposition temperatures greater than about 160° C. The increase in autodecomposition temperature of the resist is achieved by selecting substituent sidechains on the acid labile group which exhibit increased stability. Sidechain stability is conferred by selecting a side chain which, upon acid catalyzed deprotection, results in a less stable intermediate carbonium ion than the t-butyl ion. Sidechain structures which provide increased autodecomposition stability include secondary structures capable of forming secondary carbonium ion intermediates and having an available proton adjacent to the carbonium ion formed during cleavage. This adjacent proton is lost in an elimination reaction to form a free acid and an olefin. Examples of moieties which can be used as secondary side chain structures include secondary alkyl, including both cyclic and open chain alkyl, such as cyclohexyl-, sec-butyl, isopropyl, isobutyl, 2-pentyl, etc. wherein the side chain is comprised of up to about 10 carbons, with up to about 6 carbons being preferred; substituted deactivated secondary benzyl such as 1-(4-nitrophenyl) alkyl-, 1-(3-methoxyphenyl) alkyl-, and 1-(4-methoxycarbonylphenyl) alkyl-, wherein the alkyl group comprises up to about 4 carbons, and 1-(3-halophenyl) alkyl, wherein the halogen is Cl, Br, or I; and 1-(deactivated heterocyclic) secondary alkyl such as 1-(2-tetrahydrofurfuryl) alkyl- and 1-(4- or 2-pyridyl) alkyl. Examples of preferred secondary side chain structures include secondary cyclic such as cyclohexyl-, and open chain such as sec-butyl, 2-pentyl, isopropyl, isobutyl, etc., wherein the side chain is comprised of up to about 10 carbons with up to about 6 carbons being preferred); substituted deactivated secondary benzyl such as 1-(4-nitrophenyl) ethyl - and 1-(3-methoxyphenyl) ethyl-; and 1-(deactivated heterocyclic) secondary alkyl such as 1-(2-tetrahydrofurfuryl) ethyl-.

The resist compositions comprising acid labile groups pendant to the polymer backbone are sensitive to ultraviolet (UV), electron beam, or X-ray radiation. All of the resist compositions can be processed to form positive tone or negative tone images, and are comprised of at least one polymer, copolymer, or terpolymer having recurrent acid labile groups, and a photoactive compound capable of generating an acid upon exposure to radiation.

There are processing advantages in using resist polymers which have not only a high autodecomposition temperature, but which also form a thermally stable (in terms of plastic flow) polymer network after the acid labile or photo labile functional group undergoes change during imaging of the resist. Thus, it is desirable to use a polymeric material having a $T_g$ of 160° C. or greater, preferably 200° C. or greater after deprotection (after removal of the acid labile group). This plastic flow thermal stability is obtained in the manner as described in U.S. Patent Application, Ser. No. 890,427, filed July 28, 1986 now abandoned and refiled as U.S. Patent Application Ser. No. 215,966, filed on July 7, 1988, and assigned to the assignee of the present invention. The polymeric material is selected from polymeric structures which, in the deprotected state, have a hydrogen bond donor and a free hydrogen bond acceptor, such that a hydrogen bonded network is generated upon deprotection of the polymeric structure, and wherein the hydrogen bonded network requires energy to break. Examples of these types of structures include, but are not limited to, substituted polyvinylbenzoates, substituted maleimide-comprising polymers and similar polymeric congeners such as polymers comprising substituted 1,2,4-triazoline-3, 5-dione, substituted styrene-maleimide copolymers and terpolymers, substituted styrene-acrylate copolymers and terpolymers, and other copolymers or terpolymers comprising styrene and containing functionalities capable of hydrogen bonding, wherein oxygen, sulfur or nitrogen moieties within the polymeric structure are substituted with an acid labile functional group or a photo labile functional group. Examples of polymers, copolymers, and terpolymers which can be used in the present invention, wherein acid labile groups are pendant to the polymer backbone, include substituted polyvinyl benzoates, substituted polyvinyl phenols, substituted maleimide-comprising polymers, substituted styrene-maleimide copolymers and terpolymers, substituted styrene-acrylate copolymers and terpolymers, and other copolymers or terpolymers comprising styrene and containing functionalities capable of hydrogen bonding.

The acid labile functional group comprises, for example, a carboxylic acid ester, a carbonic acid ester, a carbamate, a triamide, or other isosteric functionalities. Esters, carbamates, and triamides which undergo acid catalyzed $S_n$-1 cleavage or hydrolysis may be useful. Esters, carbamates, and triamides which undergo $A_{AL}$-1 type cleavage and which have an available proton adjacent to the carbonium ion formed during cleavage, or which undergo rearrangement such that a carbonium ion is generated with an adjacent alpha proton, are preferred.

It is possible to produce either a positive tone patterned resist (wherein the irradiated area is removed upon development) or a negative tone patterned resist (wherein the nonirradiated area is removed upon development). When a positive tone patterned resist is produced, the resist material remaining after patterning is that which has not been deprotected; when the polymer comprising the photoresist is one which exhibits the increase in autodecomposition in accordance with the present invention, the patterned resist can be used at processing temperatures greater than 160° C. and in some cases as high as 250° C. The only exception to the above is homopolymers of substituted polyvinyl phenol, wherein the nondeprotected polymer in the positive tone patterned resist exhibits a low thermal stability in terms of plastic flow ($T_g$) of about 130° C. to 140° C. This thermal stability can be increased by techniques such as crosslinking. When a negative tone patterned resist is produced, the resist material remaining after patterning is that which has been deprotected; when the polymer comprising the photoresist is one which is capable of hydrogen bonding upon deprotection, the patterned resist can be used at processing temperatures greater than about 160° C. and in some cases as high as 250° C.

In accordance with the present invention, an increase in the autodecomposition temperature of the polymer comprising the photoresist, to a temperature greater than about 160° C., is obtained by selecting substituent side chains on the acid labile group which exhibit a less stable intermediate carbonium ion than the t-butyl ion, as previously described.

DESCRIPTION OF THE PREFERRED EMBODIMENTS

The syntheses of many of the polymers which can be used in the present invention are well documented in the literature. In addition, the syntheses of the polymers in the list which follows are described in U.S. Patent Application No. 890,427, filed July 28, 1986, and assigned to the assignee of the present invention. U. S. Patent Application No. 890,427 is hereby incorporated by reference. The syntheses described in that case include the following polymers which are particularly of interest in the present invention: poly(styrene-co-N-4-t-butyloxycarbonyl-oxyphenyl)-maleimide, poly(styrene-co-0-t-butyloxycarbonyl-N-hydroxy)-maleimide, poly(styrene-co-N-(formyloxy)-maleimide, poly(4-t-butyloxycarbonyl-oxystyrene-co-N-methyl-maleimide), and poly(4-t-butyloxycarbonyloxy-styrene-co-N-methylmaleimide-comaleimide). In cases wherein the synthesis of a particular polymer is not known in the art, or wherein the particular polymer is not commercially available, the method of synthesis precedes the description of the preferred process for using the present invention.

A few of the many possible embodiments of the present invention are described in the examples which follow:

EXAMPLE 1

Figure 3A:
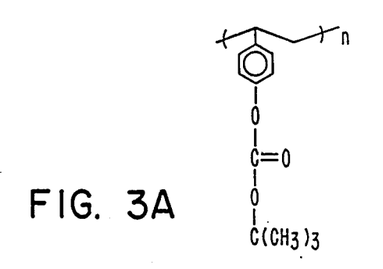
FIG. 3A shows the structure of poly(t-butyloxycarbonyloxystyrene.

Homopolymers of poly(4-t-butyloxy carbonyloxystyrene), the structure of which is shown in FIG. 3A, are known in the art as being useful in both positive and negative working resist compositions. Their use is disclosed in U.S. Pat. No. 4,491,628 to Ito et al. The autodecomposition temperature of the t-butyl sidechain is about 150° C., as previously described.

The t-butyl sidechain can be replaced with secondary sidechain structures to increase the auto decomposition temperature of a resist comprising the homopolymer thus produced.

Figure 3B:
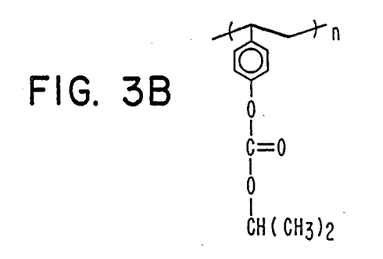
FIG. 3B shows the structure of poly(4-(2-propyl)oxycarbonyloxystyrene).

EXAMPLE 1A: FIG. 3B shows the structure of poly(4-(2-propyl) oxycarbonyloxystyrene) which has exhibited an auto decomposition temperature of about 235° C. as measured by TGA in the manner previously described. Poly(4-(2-propyl)-oxycarbonyloxystyrene) was prepared by combining poly(p-hydroxystyrene) (12 gm, 0.10 mole) and isopropylchloroformate (12.9g, 1.05 equiv.) in 300 ml THF at room temperature. Triethylamine (10.6g, 1.05 equiv) in 30 ml THF was added during a 10 minute period. The reaction mixture was stirred an additional hour. After filtering to remove a white solid, the filtrate was concentrated to 100 ml. Slow addition of the concentrated filtrate to a stirred solution of MeOH (600 ml) precipitated the polymer which was filtered and dried overnight at 40° C. under vacuum to yield 16 gms.

A typical formulation of a photoresist comprised of poly(4-(2-propyl) oxycarbonyl oxystyrene) was prepared as follows: A mixture of the polymer with about 5 to about 12% (weight/weight of polymer) triphenyl sulfonium hexafluoroantimonate sensitizer was dissolved in propylene glycol methyl ether acetate (PMA) to give a solids concentration of about 20% by weight total and was filtered to 0.2μm. The resist solution was spin cast onto a wafer to give film thicknesses ranging from about 0.7 to about 2.0μm. These films demonstrated an autodecomposition temperature greater than 193° C., as evidenced by absorbance spectrum of the cast material before and after a 193° C., bake for 45 minutes.

The photoresist was used to generate single layer microlithographic resist structures. The cast film was baked at 130° C. for about 5 minutes, imagewise exposed using deep UV (200–300nm) radiation, and post-exposure baked at 135° C. for about 3 minutes. Image development was accomplished on a spin coating tool by covering the wafer surface with anisole for 1 minute and then spinning at about 2000 rpm for about 30 seconds, while rinsing with anisole during the first 10 seconds of the spin. Lithographic features about 1.5μm in size were produced by this method.

Figure 3C:
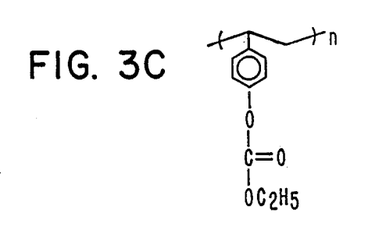
FIG. 3C shows the structure of poly(4-ethyloxycarbonyloxystyrene).

EXAMPLE 1B: FIG. 3C shows the structure of poly (4-ethyloxycarbonyloxystyrene) which has exhibited an autodecomposition temperature of about 280° C. as measured by TGA at 10° C. per minute.

Although the poly (4-ethyloxycarbonyloxystyrene) exhibits a desirable auto decomposition temperature, it is not as useful as a resist polymer due to the higher dosage of radiation required to produce an image.

Poly(4-ethyl oxycarbonyl oxystyrene) was prepared in the same manner as poly (4-(2-propyl) oxycarbonyl oxystyrene) except that ethyl chloroformate was substituted for isopropyl chloroformate. A UV absorbance spectrum of the product indicates less than 5% of the hydroxyl moieties remain unconverted to carbonate. A mixture of the polymer with about 4% (weight/weight of polymer) triphenyl sulfonium hexafluoroantimonate was dissolved in PM acetate to give a 20% total solids content, and was filtered to 0.2μm. When the resist was spin cast on a wafer and, prebaked, and exposed as in EXAMPLE 1A above, according to U.V. spectrum no significant change in polymer structure occurred even after exposure to a radiation dose as high as 1 Joule/cm² followed by a 130° C., 15 minute post-expose bake.

EXAMPLE 2

Three different maleimide-comprised polymers available from Eastman Kodak company were converted to polymers comprising acid labile functional groups of the type which exhibit good thermal stability in terms of plastic flow (demonstrate a $T_g$ in the range of 200° C. or higher) and can be used in applications of the present invention. The three maleimide-comprised polymers included: poly(styrene-co-N-(4-hydroxyphenyl)-maleimide, poly(stilbene-co-N-(4-hydroxyphenyl)maleimide), and poly(ethylacrylate-co-N(4-hydroxyphenyl-maleimide).

Figure 1A:
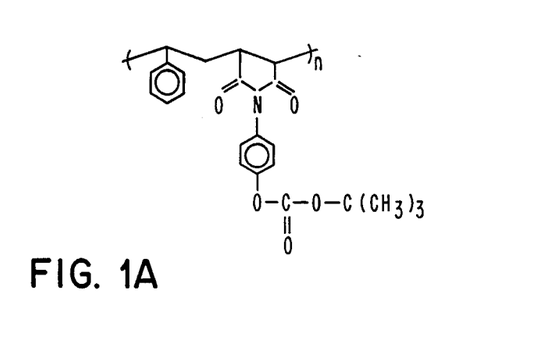
FIG. 1A shows the structure of poly(styrene-co-N(4-t-butyloxycarbonyloxyphenyl)-maleimide.

EXAMPLE 2A: The poly(styrene-co-N-(4-hydroxyphenyl)-maleimide was converted to poly(styrene-co-N(4-t-butyloxycarbonyloxyphenyl)-maleimide (FIG. 1A) by a reaction between the poly(styrene-co-N-(4-hydroxy-phenyl)-maleimide, 4-dimethylaminopyridine, di-t-butylpyrocarbonate, and triethylamine in tetrahydrofuran solution. Specifically, a typical synthesis is as follows: The di-t-butyl pyrocarbonate was added to a solution of the above-described reactants and stirred for about 18 hours at about 20° C. After removal of the solvent, the residue was dissolved in methylene chloride, treated with sodium bicarbonate solution, and the polymer was precipitated by addition to ethyl ether. Spectral analysis of reaction products indicates a typical conversion of hydroxyl moieties to carbonate in excess of 99 %. The autodecomposition temperature of the poly(styrene-co-N-(4-t-butyloxy-carbonyloxyphenyl)-maleimide is about 140° C. The negatively imaged material exhibits thermal stability in terms of plastic flow, as indicated by its $T_g$, of about 220 ° C.; thermal crosslinking of the polymer can be used to increase the $T_g$ to about 240° C.

The poly(styrene-co-N-(4-t-butyloxycarbonyloxyphenyl)-maleimide can be used in a portable-conformable-mask (PCM) lithographic application as described in U.S. Patent Application, Ser. No. 890,427, previously incorporated by reference.

In order to increase the autodecomposition temperature of the maleimide-comprised polymer described in this example, the t-butyl side chain on the recurrent acid labile carbonate portion of the polymer molecule was replaced with an isopropyl group, as described in EXAMPLE 1B, below.

Figure 1B:
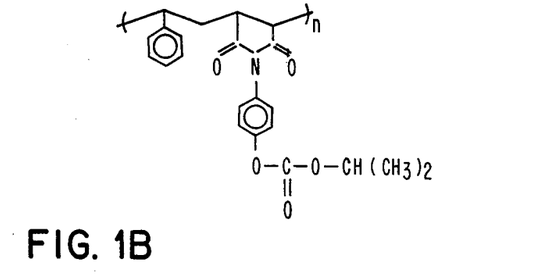
FIG. 1B shows the structure of poly(styrene-co-N(4-(2-propyl)-oxycarbonyloxyphenyl)-maleimide.

EXAMPLE 2B: Poly(styrene-co-N-(4-(2-propyl)-oxycarbonyloxyphenyl)-maleimide, as shown in FIG. 1B, can be prepared by substituting isopropylchloroformate for the di-t-butyl-pyrocarbonate in the reaction described in EXAMPLE 2A. The poly(styrene-co-N-(4-(2-propyl)-oxycarbonyloxyphenyl)-maleimide is both thermally stable at and has an autodecomposition temperature greater than 220° C. A negatively imaged photoresist comprised of this polymer is also crosslinkable, resulting in an increase of approximately 20° C. in the $T_g$ (from about 220° C. to about 240° C.).

A typical formulation of a photoresist comprised of the poly(styrene-co-N-(4-(2-propyl)-oxycarbonyloxyphenyl)-maleimide was prepared as follows: A mixture of the copolymer with about 5% (weight/weight of polymer) triphenylsulfonium hexafluoroantimonate was dissolved in gammabutyrolactone at a concentration of about 15% by weight and the solution was filtered. Other solvents can also be used, including N-methyl pyrrolidone (NMP) and propylene glycol methyl ether acetate (PMA). Antireflective dyes may be added. The resist solution was spin cast onto a wafer to give high quality films with low defect densities and with film thicknesses ranging between 0.7 and 2.5 micrometers.

Figure 2:
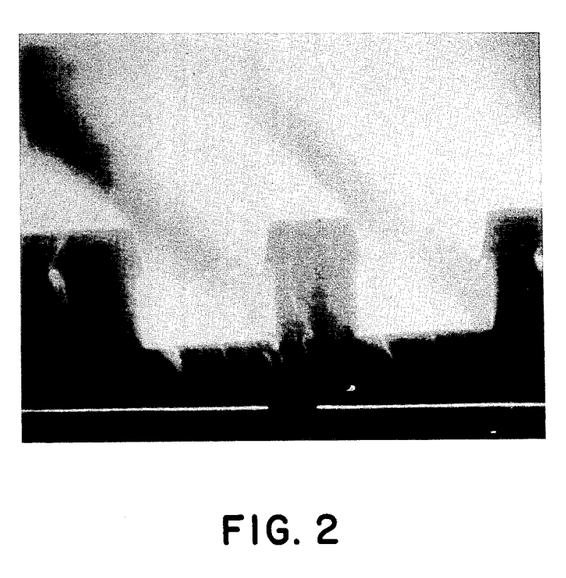
FIG. 2 shows an SEM of a bilayer resist structure created using a portable-conformable mask (PCM) process, wherein a poly(styrene-co-N-(4-(2-propyl)-oxycarbonyloxyphenyl)-maleimide comprised photoresist was used to form the underlaying layer and a novolak comprised photoresist was used to form the overlaying imaging layer.

The photoresist formulation above can be used in a PCM lithography process of the type described in EXAMPLES 4C and 4D. A SEM of the resist structure produced using this formulation in the PCM process is shown in FIG. 2. The photoresist has also been used to create single layer microlithographic resist structures.

EXAMPLE 3

Additional polymeric photoresists which exhibit good thermal stability in terms of plastic flow (a $T_g$ in the range of 200° C. or higher) include poly(4-t-butyloxycarbonyloxystyrene-co-N-methylmaleimide) and various derivatives thereof. The photoresists wherein the t-butyl side chain on the acid labile group has been replaced by an isopropyl side chain also show the improved autodecomposition temperature, as previously described above for other polymeric resists.

Figure 4A:
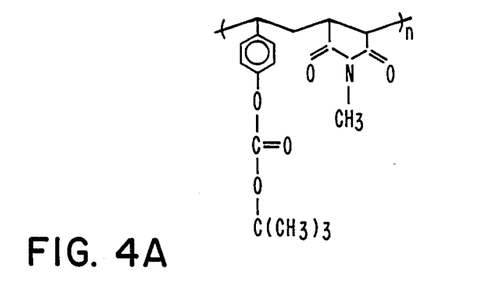
FIG. 4A shows the structure of poly(4-t-butyloxycarbonyloxystyrene-co-N-methyl-maleimide).

EXAMPLE 3A: Poly(4-t-butyloxycarbonyloxystyrene-co-N-methylmaleimide) was synthesized using free radical copolymerization of N-methylmaleimide and 4-t-butyloxycarbonyloxystyrene with AIBN in toluene at about 70° C. over about a 16 hour time period. A 1:1 alternating copolymer was isolated. The structure obtained is shown in FIG. 4A. This copolymer undergoes autodecomposition, accompanied by about a 20% by volume shrinkage, at about 160° C. to about 180° C., but no plastic flow or melting occurs over this temperature range. The phenolic polymer which results on deprotection or removal of the acid labile moiety exhibits a $T_g$ of about 250° C. as measured by DSC.

Figure 5A:
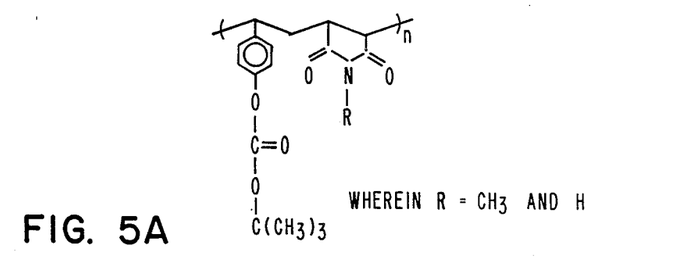
FIG. 5A shows the structure of poly(4-t-butyloxycarbonyloxystyrene-co-N-methylmaleimide-comaleimide).

EXAMPLE 3B: A terpolymer related to the copolymer of EXAMPLE 3A, containing up to about 15% by weight non-alkylated maleimide, has also been prepared in a manner similar to EXAMPLE 3A. The product of the reaction was a polymer with a backbone of 1:1 alternating maleimide/styrene residues. The methyl and hydrogen substituents were randomly distributed on the maleimide nitrogens. This is poly(4-t-butyloxy-carbonyloxy-styrene-co-N-methylmaleimide-co-maleimide) which is illustrated if FIG. 5A. Thermal performance of this terpolymer is essentially the same as that of the copolymer of EXAMPLE 3A.

Figure 4B:
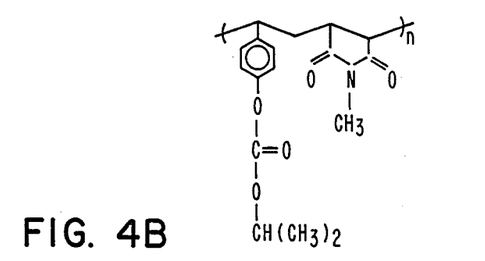
FIG. 4B shows the structure of poly(4-(2-propyl)-oxycarbonyloxystyrene-co-N-methylmaleimide).
Figure 5B:
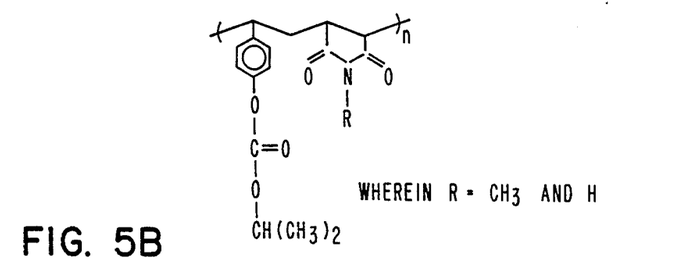
FIG. 5B shows the structure of poly(4-(2-propyl)-oxycarbonyloxystyrene-co-N-methyl-maleimide-co-maleimide).

EXAMPLES 3C AND 3D: The same basic copolymer and terpolymer as those described in EXAMPLES 3A and 3B, respectively, wherein the t-butyl side chain is replaced by an isopropyl side chain are shown in FIGS. 4B and 5B, respectively. These polymers have been synthesized directly from the corresponding monomers by free radical polymerization and also by esterification of the phenolic polymers. Thermal analysis has demonstrated an autodecomposition temperature for these materials ranging from about 240° C. to about 250° C. The $T_g$ of the deprotected copolymers and terpolymers generated upon imaging ranges from about 200° C. to about 205° C. No evidence of outgassing, decomposition, or thermal flow of these polymers was observed in patterned resist films baked at about 200° C. for about 30 minutes.

The resist polymers described above can be used for single layer microlithography in either the positive or negative imaging mode, and are also useful for deep UV sensitive positive tone PCM underlayer applications. A typical resist comprises the polymer and an onium salt photosensitizer, wherein the concentration of the sensitizer ranges from about 3% to about 8% by weight based on the polymer. The resist is typically applied to a substrate using standard spin coating techniques, wherein the resist polymer is placed into solution at concentrations of up to about 25% by weight in a solvent such as 1-methyl-2-pyrrolidone, n-methylmorpholine, or gammabutyrolactone, or solvent mixtures containing any of these or similar solvents. Resist solutions of this type have been spin coat applied onto silicon wafers to provide high quality films with low defect levels and film thicknesses ranging from about 0.7 to about 2.5 micrometers in thickness. Such films provide high contrast during imaging; for example, the polymers described in EXAMPLES 3A and 3B exhibit a contrast value ratio(gamma) greater than 3.8.

Either a positive tone or a negative tone pattern can be developed from the patternwise irradiated resists of the present invention, depending on the developer used. In the portions of the resist on which the radiation falls, the polymer recurrent acid labile pendant groups are cleaved to form polar recurring units. Thus, a positive tone pattern is produced if an alkaline developer or polar solvent developer is used to remove the irradiated areas of the resist. The unexposed portions of the resist are nonpolar and they can be removed to create a negative tone pattern using a nonpolar solvent developer.

Figure 6:
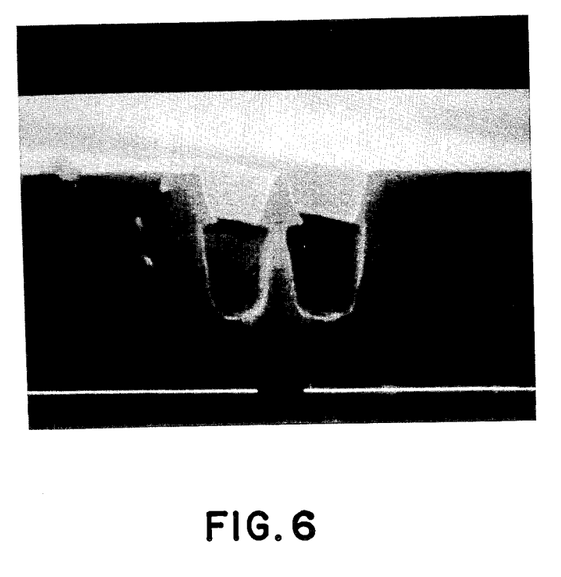
FIG. 6 shows a SEM of a bilayer resist structure created using a PCM process wherein the underlayer was formed using a resist comprising poly(4-(2-propyl)-oxycarbonyloxystyrene-co-N-methylmaleimide) and the overlaying imaging layer was formed using a resist comprising a novolak.

The polymers of this example have been used in a PCM process for producing bilayer resist structures as follows: A substrate such as a silicon wafer surface was first treated with an adhesion promoter such as hexamethyldisilazane. Polymers of the type described in EXAMPLES 3C AND 3D, in combination with a photosensitizer of the type described above, were spin applied to the wafer and heat treated to dry the film. Subsequently, a diazoquinone sensitized novolak photoresist in an appropriate solvent such as dipropylene glycol monomethyl ether was applied over the surface of the resist polymer of the type described in this example. The novolak photoresist was imagewise exposed to near or mid UV radiation, and developed in aqueous base using standard techniques, to create a patterned layer overlaying the resist layer comprising one of the polymers of the type described in this example of the present invention. The resist structure was then exposed to radiation of wavelength ranging from about 200 nm to about 300 nm so that exposed portions of the underlaying resist layer comprising the polymer of the present invention was exposed to radiation in areas wherein the novolak resist is not present. The resist structure was heat treated to obtain chemical reaction in the exposed portions of the underlaying resist layer, and the underlaying layer was then developed in an aqueous alkaline solution containing an alcohol such as isopropyl alcohol. Bilayer resist structures with lithographic features about one micron in size were produced using this method. A bilayer resist structure comprised of an overlaying novolak layer and an underlaying poly 4(2-propyl)oxycarbonyloxystyrene-Co-N-methylmaleimide layer, produced using this method is shown in FIG. 6.

EXAMPLE 4

Figure 7A:
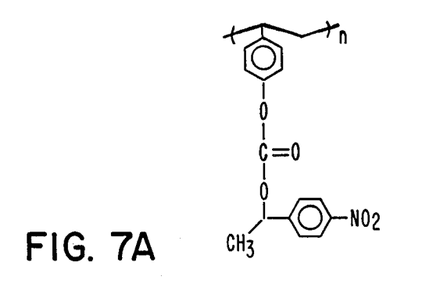
FIG. 7A shows the structure of poly(4-(1-(4nitrophenyl)ethyl)oxycarbonyloxystyrene).

Homopolymers of substituted polyvinylphenol, comprising recurrent acid labile functional groups having side chains which are in accordance with the present invention have been synthesized and used to produce patterned resist films as follows:

EXAMPLE 4A: Poly(4-(1-(4-nitrophenyl)ethyloxycarbonyloxystyrene (FIG. 7A) was prepared from poly(4-hydroxystyrene), available from the Maruzen Oil Company, by treatment with trichloromethyl chloroformate and 1-(4-nitrophenyl)ethanol. Specifically, a solution of 4-nitroacetophenone in ethanol was treated with sodium borohydride at about 0° C. for about 4 hours, then quenched by the addition of water. Extraction with ethyl acetate followed by drying and concentration provided crude 1-(4-nitrophenyl)ethanol, which was purified by recrystallization. A solution of 1-(4-nitrophenyl)ethanol in tetrahydrofuran (THF) was added to a solution of excess trichloromethyl chloroformate and triethylamine in THF, stirred at reflux for about 2 hours, filtered to remove the solids, and concentrated under vacuum. The resulting oil was dissolved in THF and added to a solution of poly(4-hydroxystyrene), 4-dimethylaminopyridine, and triethylamine in THF. This mixture was stirred for about 18 hours at about 20° C., filtered, then concentrated. The residue was dissolved in methylene chloride, treated with aqueous sodium bicarbonate solution, and the polymer was precipitated by addition into methanol.

A resist film was then spin cast from a solution of the poly(4-(1-(4-nitrophenyl)ethyl)oxycarbonyloxystyrene as above. A typical solution can contain about 15% by weight solids and about 5% (weight/weight of polymer) of triphenylsulfonium hexafluoroantimonate in a solvent such as PMA or diglyme. Infrared analysis of the resist film indicated a typical conversion of the hydroxyl moieties to carbonate in excess of 98% during synthesis of the poly(4-(1-(4-nitrophenyl)ethyl) oxycarbonyloxystyrene. The polymer was shown by IR to undergo cleavage of more than 90% of the acid labile groups after blanket exposure to about 50 mJ of deep UV radiation at a wavelength of between about 200 nm and 300 nm, followed by heat treatment at about 130° C. for about 15 minutes.

The autodecomposition temperature of poly(4-(1-(4-nitrophenyl)ethyl)oxycarbonyloxystyrene is about 205° C., as measured by TGA in air at a heating rate of about 5° C./minute.

Figure 7B:
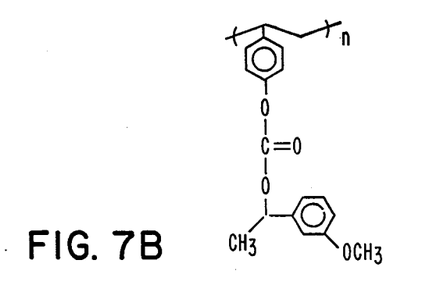
FIG. 7B shows the structure of poly(4-(1-(3methoxyphenyl)ethyl)oxycarbonyloxystyrene).

EXAMPLE 4B: Poly(4-(1-(3-methoxyphenyl)ethyl) oxycarbonyloxystyrene (FIG. 7B) can be prepared by substituting 3-methoxyacetophenone for the 4-nitroacetophenone in the reaction sequence described in EXAMPLE 4A. The autodecomposition temperature is about 179° C. at a heating rate of about 5° C./minute. Cleavage of the side chain, as described in EXAMPLE 4A, was observed after exposure of a cast film to deep UV radiation followed by heating to about 130° C. for about 15 minutes.

Figure 7C:
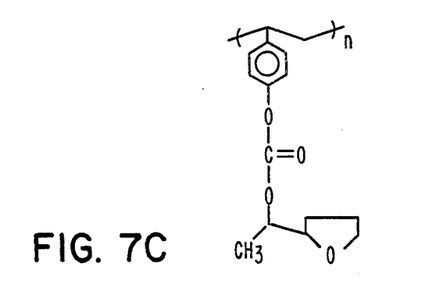
FIG. 7C shows the structure of poly(4-(1-(2tetrahydrofurfuryl)ethyl)oxycarbonyloxystyrene).

EXAMPLE 4C: Poly(4-(1-(2-tetrahydrofurfuryl) ethyl)oxycarbonyloxystyrene (FIG. 7C) can be prepared by substituting 2-acetyltetrahydrofuran for the 4-nitroacetophenone in the reaction sequence described in EXAMPLE 4A. The autodecomposition temperature is about 200° C. at a heating rate of about 5° /minute. Cleavage of the side chain, as described in EXAMPLE 4A was observed after exposure of a cast film to deep UV radiation followed by heating to about 130° C. for about 15 minutes. While only the preferred embodiments of the present invention are described above, many potential modifications which fall within the generic concept of the invention will occur to those skilled in the art upon a reading of the present disclosure. Such modifications in terms of polymer structure, resist composition, photosensitizer (photoactive compound) and use of the resist composition to produce submicron patterned resist structures are intended to be within the scope of the present invention, as indicated by the claims which follow.

What is claimed is:

1. A resist comprising at least one polymer copolymer or terpolymer comprising a maleimide or styrene as the polymer backbone having a recurrent acid labile group pendent to the polymer backbone and a photoactive compound capable of generating an acid upon exposure to radiation, wherein the improvement comprises: selecting the acid labile group from carboxylic acid esters wherein the ester portion includes a secondary alkyl substituent side chain on said acid labile group which is capable of forming a secondary carbonium ion intermediate and having an available proton adjacent to the carbonium ion formed during cleavage.

2. The resist of claim 1 wherein the autodecomposition temperature of said resist is greater than 160° C.

3. The resist of claim 1 wherein said substituent side chain, upon acid-catalyzed deprotection of said acid labile group, is capable of forming a less stable intermediate carbonium ion than a t-butyl ion.

4. The resist of claim 1 wherein said substituent side chain is selected from the group consisting of cyclic secondary alkyl, open chain secondary alkyl, substituted deactivated secondary benzyl, and 1-(deactivated heterocyclic) secondary alkyl.

5. The resist of claim 4 wherein said cyclic and open chain secondary alkyls are comprised of up to 10 carbon atoms.

6. The resist of claim 5 wherein said cyclic and open chain secondary alkyls are comprised of up to 6 carbon atoms.

7. The resist of claim 6 wherein said secondary alkyls are selected from the group consisting of cyclohexyl, sec-butyl, isopropyl, isobutyl, and 2-pentyl.

8. The resist of claim 4 wherein said substituted deactivated secondary benzyl is selected from the group consisting of 1-(4-nitrophenyl)alkyl, 1-(3methoxyphenyl)alkyl, and 1-(4-methoxycarbonyl-phenyl)alkyl, wherein the alkyl group comprises up to 4 carbon atoms, and 1(3-halophenyl alkyl, wherein the halogen is Cl, Br, or I, wherein the alkyl comprises up to 4 carbon atoms.

9. The resist of claim 8 wherein said substituted deactivated secondary benzyl is selected from the group consisting of 1-(4-nitrophenyl) ethyl and 1-(3-methoxyphenyl) ethyl.

10. The resist of claim 4 wherein said 1-(deactivated heterocyclic) secondary alkyl is selected from the group consisting of 1-(2-tetrahydrofurfuryl) alkyl, (1-(2-pyridyl) alkyl and 1-(4-pyridyl) alkyl.

11. The resist of claim 10 wherein said 1-(deactivated heterocyclic) secondary alkyl is 1-(2-tetrahydrofurfuryl) ethyl.

* * * * *